United States Patent [19]

Eitrheim

[11] Patent Number: 5,687,202

[45] Date of Patent: Nov. 11, 1997

[54] PROGRAMMABLE PHASE SHIFT CLOCK GENERATOR

[75] Inventor: John K. Eitrheim, Plano, Tex.

[73] Assignee: Cyrix Corporation, Richardson, Tex.

[21] Appl. No.: 427,539

[22] Filed: Apr. 24, 1995

[51] Int. Cl.[6] ...................................................... H03D 3/24
[52] U.S. Cl. ........................... 375/376; 375/373; 375/374; 375/375; 331/2; 331/10; 331/18; 331/25; 327/156; 327/160
[58] Field of Search .................................. 375/371, 373, 375/374, 375, 376, 354; 337/1 R, 1 A, 2, 10, 16, 18, 25, 34; 327/156, 159, 160

[56] References Cited

U.S. PATENT DOCUMENTS

| 5,329,254 | 7/1994 | Takano | 331/34 |
| 5,382,921 | 1/1995 | Estrada et al. | 331/1 A |
| 5,418,822 | 5/1995 | Schlachter et al. | 375/354 |

*Primary Examiner*—Wellington Chin
*Assistant Examiner*—Congvan Tran
*Attorney, Agent, or Firm*—Andrew S. Viger; John L. Maxin

[57] ABSTRACT

A programmable phase shift clock generator is disclosed including a phase comparator, an up-down counter, a ring oscillator, and an adjustable delay line for determining a digital signature of an input clock and precisely generating a phase shifted clock signal.

15 Claims, 5 Drawing Sheets

PROGRAMMABLE PHASE SHIFT CLOCK GENERATOR

BACKGROUND OF THE INVENTION

1. Field of the Invention

The invention relates generally to a clock generator, and more specifically to a programmable phase shift clock generator.

2. Description of Related Art

Clock synthesizers are ubiquitous, taking on many forms ranging from phase-locked loops to delay line loops. The general theme in clock synthesis is the reconstitution of a clock signal which is a harmonic or integer multiple of a fundamental or "base" input clock. Synthesizing non-integer multiple frequencies however, poses a more difficult situation.

Known problems with phase-locked loop systems include falling out-of-lock and excessive lock times. Known problems with delay line loop systems include open loop variations in delay elements and delay quantization.

With specific reference to delay line loop systems, synthesized waveforms generally rely on input clock edges and fixed delays to approximate "quadrature" clocks (i.e. clocks shifted mid-phase, usually 90 degrees) to reconstitute clock signals of higher frequency than the fundamental or "base" input clock. Consequently, a certain amount of ambiguity is induced into the quadrature clocks based on, inter alia, variations in delay elements and delay quantization.

It can be seen from the foregoing therefore, that there is a need for systems and methods of clock synthesis that can accurately parse and dismantle an input clock in order to accurately generate ancillary clock signals of varying phase and frequency.

SUMMARY OF THE INVENTION

To overcome the limitations of the prior art described above, and to overcome other limitations that will become apparent upon reading and understanding the present specification, the present invention discloses a programmable phase shift clock generator having a phase comparator for generating a difference between an input clock signal and a feedback signal, an up-down counter responsive to the phase comparator, for generating an n-bit count, a ring oscillator responsive to the up-down counter, for generating a loop clock signal as an output and as feedback to the phase comparator, and an adjustable delay line to provide a phase shifted clock signal from the loop clock output signal.

A feature of the present invention is providing a digital signature of an input clock for further utilization in generating ancillary clock signals.

Another feature of the present invention is the ability to precisely adjust the duty cycle of an output clock independent of the input clock frequency.

These and various other objects, features, and advantages of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a specific example of a programmable phase shift clock generator practiced in accordance with the present invention.

DESCRIPTION OF THE PREFERRED EMBODIMENTS

Figure 1:
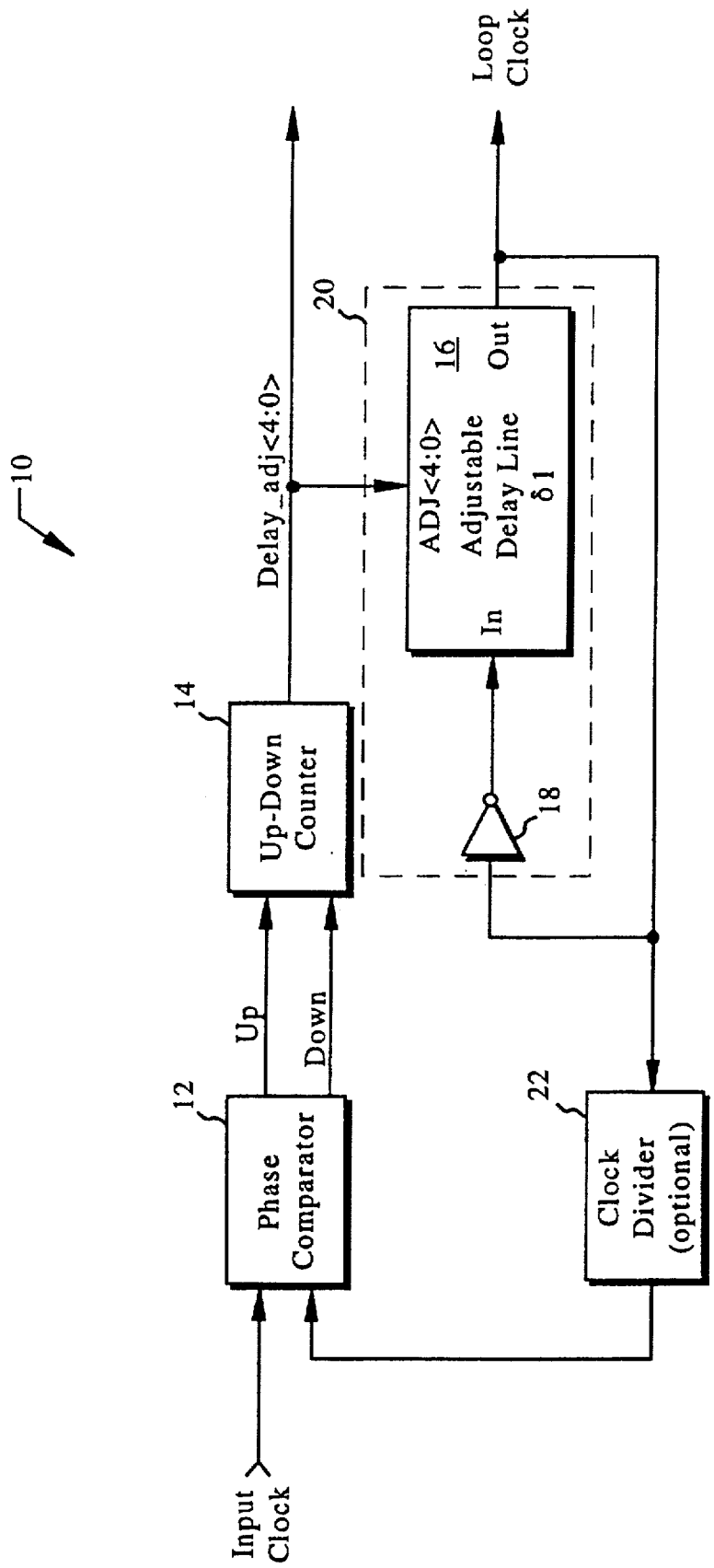
FIG. 1 is a block diagram of a preferred embodiment for a clock generator/multiplier in combination with an adjustable delay line to form a programmable phase shift clock generator practiced in accordance the principles of the present invention.

In the following description of the preferred embodiments, reference is made to the accompanying drawings which form a part hereof, and in which is shown by way of illustration specific embodiments in which the invention may be practiced. In order not to obscure the disclosure with structural details which will be readily apparent to those skilled in the art having the benefit of the description herein, the structure, control, and arrangement of conventional circuits have been illustrated in the drawings by readily understandable block representations and schematic diagrams, showing and describing details that are pertinent to the present invention. Thus, the block diagram illustrations in the figures do not necessarily represent the physical arrangement of the exemplary system, but are primarily intended to illustrate the major structural components in a convenient functional grouping, wherein the present invention may be more readily understood. It is to be understood that other embodiments may be utilized and structural changes may be made without departing from the scope of the present invention.

Referring to FIG. 1, a block diagram is depicted of the preferred embodiment for a delay line loop clock generator/multiplier 10 in combination with an adjustable delay line 16' and an optional arithmetic divider 24 to form a programmable phase shift clock generator practiced in accordance with the principles of the present invention. The clock multiplier 10 includes a phase comparator 12 to compare an input clock signal to a feedback signal and to generate up/down error pulses in response thereto. The up/down error pulses drive an up/down counter 14 which produces a five bit error count (Delay_adj<4:0>). The five bit error count (Delay_adj<4:0>) drives a ring oscillator 20 formed by an adjustable delay line 16 (described in more detail hereinbelow) having an inverter 18 coupled between its output and input. The output of the ring oscillator 20 provides a loop clock signal which is further processed as discussed in more detail hereinbelow. The loop clock signal is also fed back to the phase comparator 12 for comparison with the input clock. An optional clock divider 22 maybe inserted between the loop clock signal and the phase comparator 12 to scale the loop clock frequency by a factor of "n" wherein "n" is the divisor of the divider 22. Those skilled in the art will recognize many well known expedients for the phase comparator 12, up/down counter 14, ring oscillator 20, and clock divider 22, without departing from the scope of the present invention.

Figure 2:
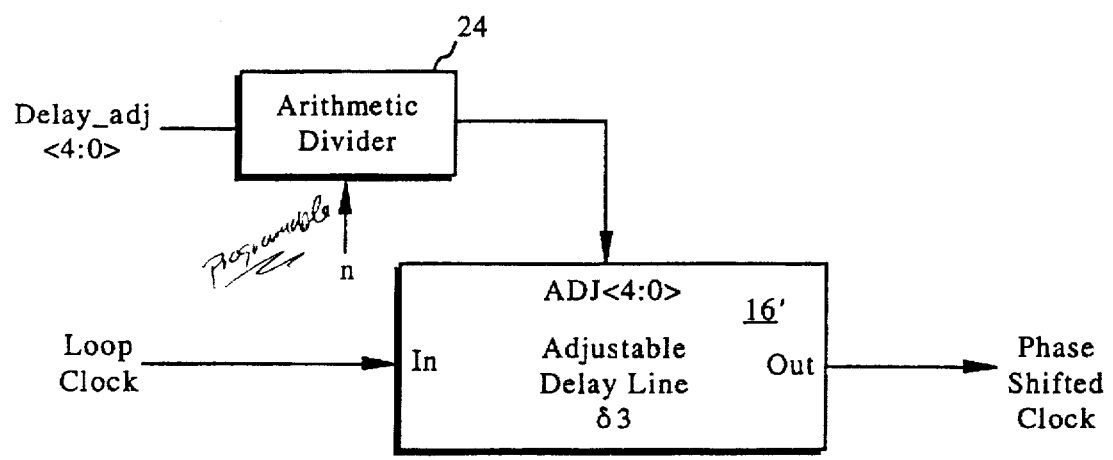
FIG. 2 is a block diagram of a preferred embodiment for the programmable phase shift clock generator practiced in accordance with the principles of the present invention.
Figure 3:
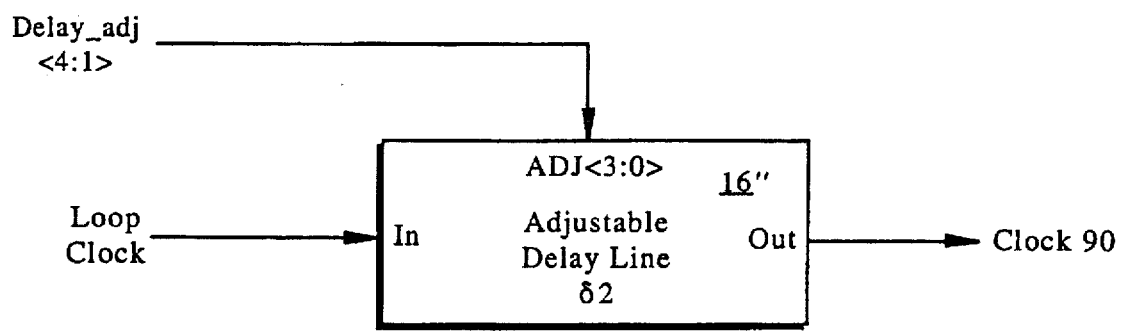
FIG. 3 is a block diagram of a specific implementation for the programmable phase shift clock generator depicted in FIG. 2.

Reference is now made to FIGS. 2 and 3 which depict block diagrams of the preferred embodiments for the programmable phase shift clock generator practiced in accordance with the principles of the present invention. FIG. 2 is a general case while FIG. 3 depicts a specific case. In FIG. 3, delay δ2 is generated by adjustable delay line 16" which is one-half the delay δ1 generated by adjustable delay line 16 in FIG. 1. It should be noted in the specific example of FIG. 3 however, that adjustable delay line 16" has only four data bits ADJ<3:0> to set the delay and that the four most significant bits (Delay_adj <4:1>) from up/down counter 14 are coupled thereto having the effect of dividing the count by a factor of two.

Figure 8:
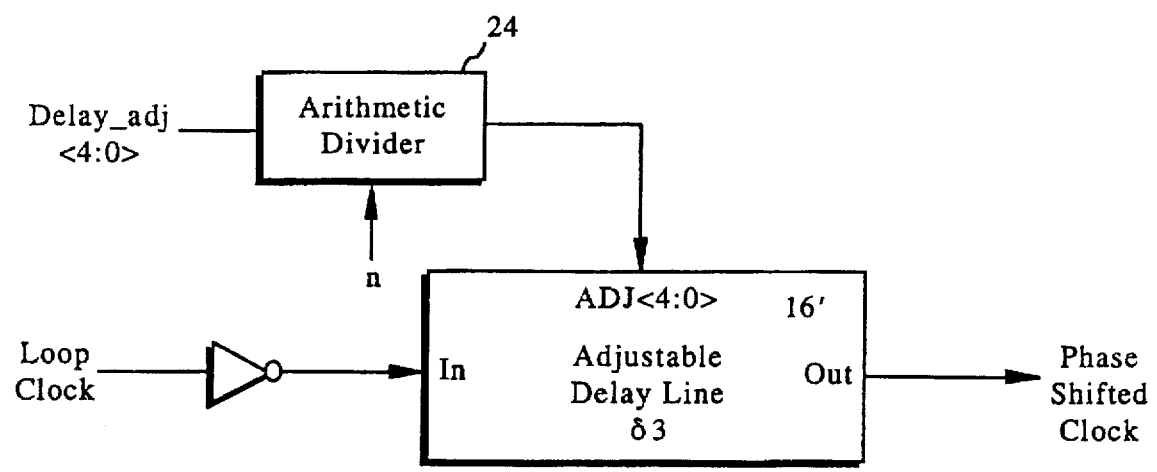

In the general case of FIG. 2, an arithmetic divider 24 is interposed between the output of counter 14 (Delay_adj <4:0>) and the adjustment input of adjustable delay line 16'. The arithmetic divider 24 having a programmable divisor of "n" has the effect of producing a variable delay δ3 in delay line 16'. Expressed simply, the loop clock is shifted by 180°/n wherein "n" is the programmable divisor of arithmetic divider 24. Alternatively as depicted in FIG. 8, the loop clock output could be inverted 180° before coupling it to delay line 16' thus giving the effect of generating a shifted clock shifted by (360°–180°/n).

Figure 4:
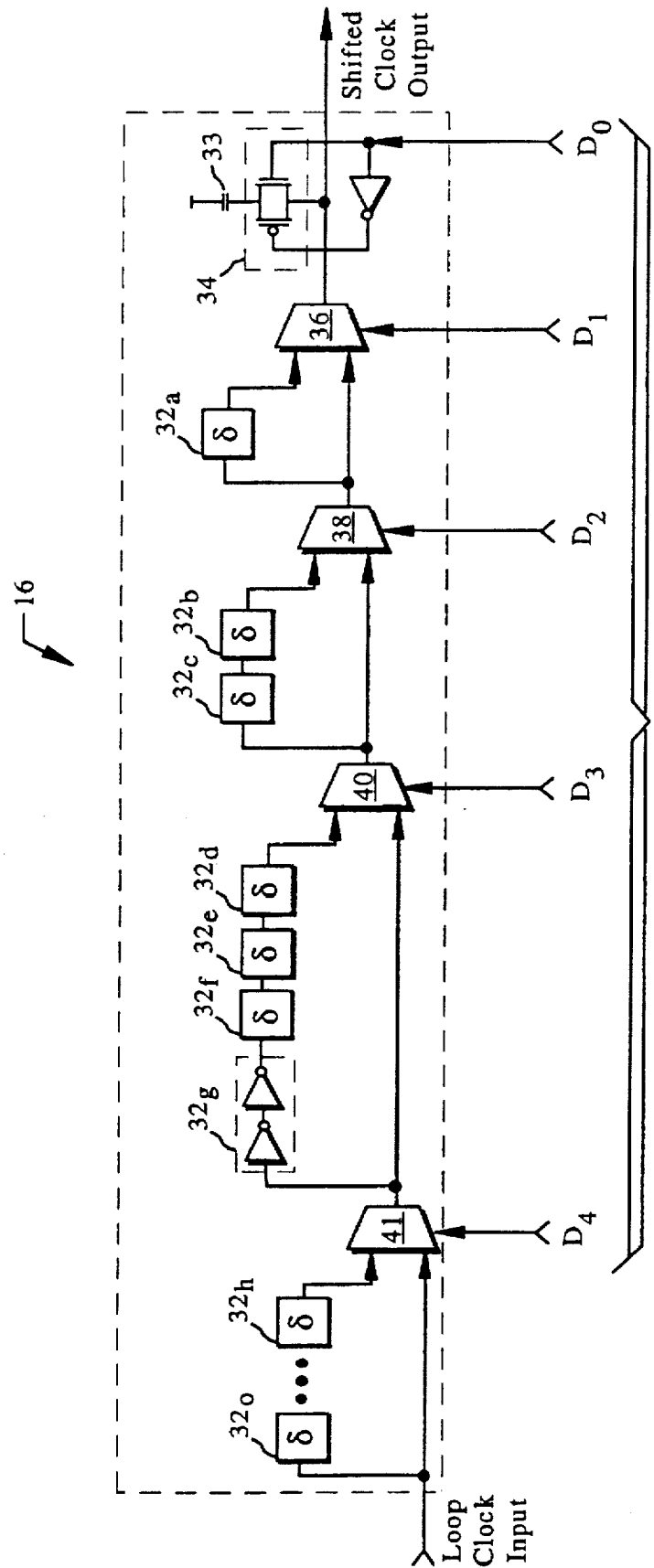
FIG. 4 is a schematic diagram of the adjustable delay line depicted in FIGS. 1–3.

Before moving along to the explanatory discussion below on waveforms generated by the circuits in FIGS. 1–3, reference is made to FIG. 4 which depicts a more detailed block diagram of the preferred embodiment for the adjustable delay line 16. In the preferred embodiment, delay lines 16–16" are substantially identical (with the notable exception that 16" has one less stage), therefore for purposes of discussion, only 16 is described. It should be understood however, that with the aid of the present disclosure, those skilled in the art will readily recognize other configurations for the adjustable delay lines 16–16" without departing from the scope of the present invention.

Delay line 16 is a five bit ($D_4$–$D_0$) digitally programmable delay. The five bits selectably induce one of thirty-two delay values into the data path between the loop clock input and the shifted clock output. The five bits ($D_4$–$D_0$) are dynamically altered by the output of up/down counter 14 (Delay_adj <4:0>).

The least significant bit ($D_0$) selects the minimum discrete delay value (0.5δ), by switching pass gate 34 on to introduce capacitor 33 to the data path. The capacitor 33 delays the loop clock input signal on the data path by a predetermined value (0.5δ). In the preferred embodiment, the Applicant has tuned the value of capacitor 33 so that 0.5δ equals the delay of a single inverter.

The next increment in delay is δ (32a–32o) which is schematically depicted as two cascaded inverters in 32g. Data bit $D_1$ controls a first multiplexer 36 having a first input coupled to the data path and a second input coupled to the data path delayed by one δ (32a). Hence, data bit $D_2$ either selects a single delay (32a) into the data path or allows the clock signal on the data path to flow through to pass gate 34.

Data bit $D_2$ controls a second multiplexer 38 having a first input coupled to the data path and a second input coupled to the data path delayed by two δs (32b–32c). The output of multiplexer 38 drives both the first input on multiplexer 36 and the second input on multiplexer 36 delayed by single delay (32a). Hence, data bit $D_2$ either inserts two delays (32b–32c) into the data path or allows the signals on the data path to flow through to the first and the second (delayed) inputs on multiplexer 36.

Data bit $D_3$ controls a third multiplexer 40 having a first input coupled to the data path and a second input coupled to the data path delayed by four δs (32d–32g). The output of multiplexer 40 drives both the first input on multiplexer 38 and the second input on multiplexer 38 delayed by two δs (32b–32c). Hence, data bit $D_3$ either inserts four delays (32d–32g) into the data path or allows the signal on the data path to flow through to the first and second (delayed) inputs on multiplexer 38.

Data bit $D_4$ controls a fourth multiplexer 41 having a first input coupled to the data path and a second input coupled to the data path delayed by eight δs (32h–32o). The output of multiplexer 41 drives both the first input on multiplexer 40 and the second input on multiplexer 40 delayed by four δs (32d–32g). Hence, data bit $D_4$ either inserts eight delays (32h–32o) into the data path or allows the signal on the data path to flow through to the first and second (delayed) inputs on multiplexer 40.

It should be understood therefore, that any one of thirty-two cumulative delays can be induced into the data path by choosing an appropriate pattern for $D_4$–$D_0$. These delays and relationship to data bits $D_4$–$D_0$ are depicted in Table 1.

TABLE 1

| $D_4$ | $D_3$ | $D_2$ | $D_1$ | $D_0$ | Delay |
|---|---|---|---|---|---|
| 0 | 0 | 0 | 0 | 0 | None |
| 0 | 0 | 0 | 0 | 1 | .5δ |
| 0 | 0 | 0 | 1 | 0 | δ |
| 0 | 0 | 0 | 1 | 1 | 1.5δ |
| 0 | 0 | 1 | 0 | 0 | 2δ |
| 0 | 0 | 1 | 0 | 1 | 2.5δ |
| 0 | 0 | 1 | 1 | 0 | 3δ |
| 0 | 0 | 1 | 1 | 1 | 3.5δ |
| 0 | 1 | 0 | 0 | 0 | 4δ |
| 0 | 1 | 0 | 0 | 1 | 4.5δ |
| 0 | 1 | 0 | 1 | 0 | 5δ |
| 0 | 1 | 0 | 1 | 1 | 5.5δ |
| 0 | 1 | 1 | 0 | 0 | 6δ |
| 0 | 1 | 1 | 0 | 1 | 6.5δ |
| 0 | 1 | 1 | 1 | 0 | 7δ |
| 0 | 1 | 1 | 1 | 1 | 7.5δ |
| 1 | 0 | 0 | 0 | 0 | 8δ |
| 1 | 0 | 0 | 0 | 1 | 8.5δ |
| 1 | 0 | 0 | 1 | 0 | 9δ |
| 1 | 0 | 0 | 1 | 1 | 9.5δ |
| 1 | 0 | 1 | 0 | 0 | 10δ |
| 1 | 0 | 1 | 0 | 1 | 10.5δ |
| 1 | 0 | 1 | 1 | 0 | 11δ |
| 1 | 0 | 1 | 1 | 1 | 11.5δ |
| 1 | 1 | 0 | 0 | 0 | 12δ |
| 1 | 1 | 0 | 0 | 1 | 12.5δ |
| 1 | 1 | 0 | 1 | 0 | 13δ |
| 1 | 1 | 0 | 1 | 1 | 13.5δ |
| 1 | 1 | 1 | 0 | 0 | 14δ |
| 1 | 1 | 1 | 0 | 1 | 14.5δ |
| 1 | 1 | 1 | 1 | 0 | 15δ |
| 1 | 1 | 1 | 1 | 1 | 15.5δ |

It should be understood that those skilled in the art, with the aid of the present disclosure, will be able to expand or contract the delay line 16 to more or less than five bits without departing from the scope of the present invention.

Figure 5:
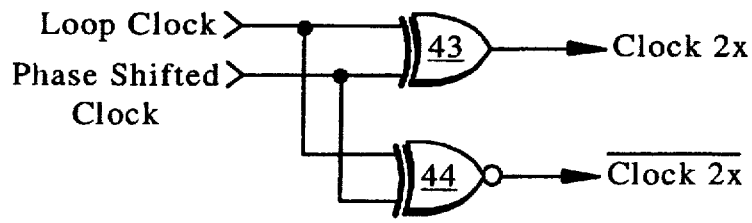
FIG. 5 is a schematic diagram of a clock doubling circuit practiced in accordance with the principles of the present invention.

Reference is now made to FIG. 5 which depicts a clock doubling circuit practiced in accordance with the principles of the present invention. XOR gate 43 and XNOR gate 44 have a first input coupled to the loop clock output from adjustable delay line 16 (δ1) and a second input coupled to the phase shifted clock (e.g. clock90) from the second adjustable delay line 16" (δ3). The outputs of XOR gate 43 and XNOR gate 44 provide Clock2x and $\overline{\text{Clock2x}}$ signals which have a frequency twice that of the loop clock and a duty cycle dependent on phase shift of the phase shifted clock input.

Figure 6:
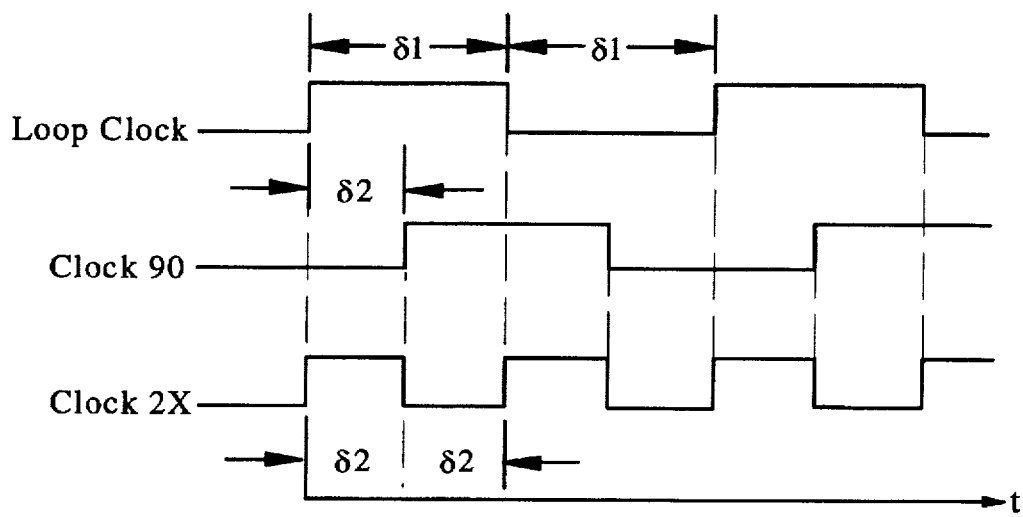
FIG. 6 is a timing diagram of signals generated in the diagrams of FIGS. 3 and 5.
Figure 7:
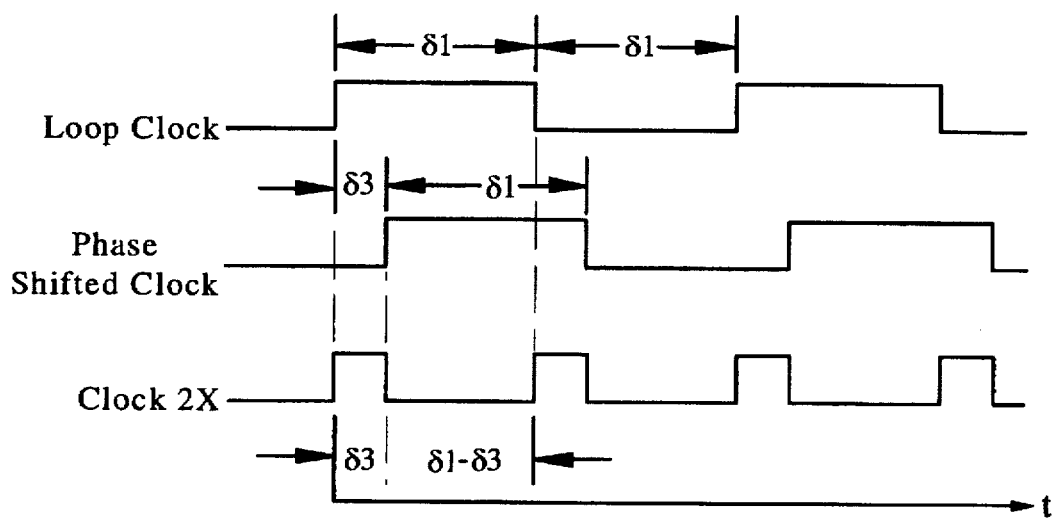
FIG. 7 is a timing diagram of signals generated in the diagrams of FIGS. 2 and 5; and, FIG. 8 is a block diagram of an alternative preferred embodiment for the programmable phase shift clock generator practiced in accordance with the principles of the present invention.

Reference is now made to FIGS. 6 and 7 which depict timing diagrams of signals generated in FIG. 5 in accordance with the principles of the present invention. FIG. 7 depicts the general case whereas FIG. 6 depicts the specific case where δ2=0.5 δ1. In both FIGS. 6 and 7, the period of loop clock is set by delay δ1. In the specific case depicted in FIG. 6, the duty cycle (i.e. the percentage of time remaining high) is 50%. The high time is set by δ2 and since δ2 is 0.5 δ1, the time remaining low is also δ2. In the general case depicted in FIG. 7, the high time is set by δ3 and the time remaining low is δ1-δ3.

Conclusion

Although the Detailed Description of the invention has been directed to certain exemplary embodiments, various modifications of these embodiments, as well as alternative embodiments, will be suggested to those skilled in the art The invention encompasses any modifications or alternative embodiments that fall within the scope of the claims.

What is claimed is:

1. A programmable phase shift clock generator comprising:
    (a) a phase comparator having a first input coupled to receive an input clock signal, a second input coupled to receive a feedback signal, and an output to provide a difference between the input clock signal and the feedback signal;
    (b) an up-down counter having an input coupled to the output of the phase comparator and an output to provide an n-bit count;
    (c) a ring oscillator having an n-bit input coupled to the output of the up-down counter and an output to provide a loop clock output signal, the loop clock output signal being coupled as the feedback signal to the second input on the phase comparator;
    (d) an adjustable delay line having an input coupled to receive the loop clock output signal, at least n−1-bit control inputs coupled to the output of the up-down counter, and an output to provide a phase shifted clock signal;
    (e) a divider interposed between the output of the ring oscillator and the second input of the phase comparator;
    (f) wherein the ring oscillator comprises an adjustable delay line having an input and an output and an inverter coupled therebetween; and;
    (g) wherein the adjustable delay line (d) has n-bit control inputs and further comprises an arithmetic divider interposed between the output of the up-down counter and the n-bit control inputs.

2. A programmable phase shift clock generator as recited in claim 1 further comprising an inverter interposed between the loop clock and the input of the adjustable delay line (d).

3. A programmable phase shift clock generator as recited in claim 1 further comprising an exclusive OR gate having a first input coupled to the loop clock output signal, a second input coupled to the phase shifted clock signal, and a 2x output to provide a clock of a frequency twice the loop clock.

4. A programmable phase shift clock generator as recited in claim 3 further comprising an exclusive NOR gate having a first input coupled to the loop clock output signal, a second input coupled to the phase shifted clock signal, and a 2x output to provide an inverted clock of a frequency twice the loop clock output signal.

5. A programmable phase shift clock generator comprising:
    (a) phase comparator means for comparing an input clock signal to a feedback signal and for generating a difference output therebetween;
    (b) up-down counter means, responsive to the difference output from the phase comparator means, for generating an n-bit error count;
    (c) ring oscillator means, responsive to the n-bit error count from the up-down counter means, for generating a loop clock output signal; and,
    (d) adjustable delay line means, coupled to the ring oscillator means and the up-down counter means, for generating a phase shifted clock signal
    (e) divider means, interposed between the ring oscillator means and the phase comparator means, for scaling the clock output signal;
    (f) wherein the ring oscillator means comprises an adjustable delay line having an input and an output and an inverter coupled therebetween; and,
    (g) wherein the adjustable delay line means (d) has n-bit control inputs and further comprises arithmetic divider means, interposed between the up-down counter means and the n-bit control inputs, for adjusting a duty cycle of the phase shifted clock signal.

6. A programmable phase shift clock generator as recited in claim 5 further comprising means for inverting the loop clock output signal substantially 180° before coupling to the input of the adjustable delay line means (d).

7. A programmable phase shift clock generator as recited in claim 5 further comprising XOR means, coupled to receive the loop clock output signal and the phase shifted clock signal, for generating a clock signal of a frequency twice the loop clock output signal.

8. A programmable phase shift clock generator as recited in claim 7 further comprising XNOR means, coupled to receive the loop clock output signal and the phase shifted clock signal, for generating an inverted clock signal of a frequency twice the loop clock output signal.

9. A method of generating a programmable phase shift clock comprising the steps of:
    (a) comparing an input clock signal to a feedback signal and generating a difference output therebetween;
    (b) generating an n-bit error count in response to step (a);
    (c) responsive to step (b), generating a loop clock output signal to an adjustable delay line and providing the loop clock output signal as the feedback signal in step (a);
    (d) generating a phase shifted clock signal response to steps (b) and (c);
    (e) dividing the loop clock output signal in step (c) before providing the loop clock output signal as the feedback signal in step (a)
    (f) wherein step (c) comprises the step of feeding back the inversion of an output from an adjustable delay line to an input on the adjustable delay line; and,
    (g) arithmetically dividing the n-bit error count in step (b) to adjust a duty cycle of the phase shifted clock signal in step (d).

10. A method as recited in claim 9 further comprising the step of exclusive ORing the loop clock output signal and the phase shifted clock signal to generate a clock signal of a frequency twice the loop clock output signal.

11. A method as recited in claim 9 further comprising the step of inverting the loop clock output signal before step (c).

12. A programmable phase shift clock generator comprising:
   (a) a delay line loop clock generator having a loop clock output and a plurality of error count bits; and,
   (b) an adjustable delay line having an input coupled to receive the loop clock output, and a plurality of control inputs coupled to at least some of the plurality of error count bits, and an output to provide a phase shifted clock signal; and,
   (c) an arithmetic divider interposed between the plurality of error count bits and the plurality of control inputs to program a phase shift into the phase shifted clock signal.

13. A programmable phase shift clock generator as recited in claim 12 further comprising an inverter interposed between the loop clock output and the input of the adjustable delay line.

14. A programmable phase shift clock generator as recited in claim 12 further comprising an exclusive OR gate having a first input coupled to the loop clock output, a second input coupled to the phase shifted clock signal, and an output clock of a frequency twice the loop clock output and having an adjustable duty cycle responsive to the adjustable delay line.

15. A programmable phase shift clock generator as recited in claim 14 further comprising an exclusive NOR gate having a first input coupled to the loop clock output, a second input coupled to the phase shifted clock signal, and an inverted clock output of a frequency twice the loop clock output signal and having an adjustable duty cycle responsive to the adjustable delay line.

* * * * *